(12) United States Patent
Chowdhury et al.

(10) Patent No.: US 12,400,833 B2
(45) Date of Patent: Aug. 26, 2025

(54) METHODS AND APPARATUS FOR PROCESSING A SUBSTRATE

(71) Applicant: Applied Materials, Inc., Santa Clara, CA (US)

(72) Inventors: Abhishek Chowdhury, Bangalore (IN); Jon Christian Farr, Tempe, AZ (US); Ravikumar Patil, Bengaluru (IN); Eller Juco, San Jose, CA (US); Yi Zheng, Sunnyvale, CA (US); Siqing Lu, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 589 days.

(21) Appl. No.: 17/189,728

(22) Filed: Mar. 2, 2021

(65) Prior Publication Data

US 2022/0285133 A1    Sep. 8, 2022

(51) Int. Cl.
    *H01J 37/32*    (2006.01)

(52) U.S. Cl.
    CPC .... *H01J 37/32449* (2013.01); *H01J 37/3244* (2013.01); *H01J 2237/334* (2013.01)

(58) Field of Classification Search
    CPC ............ H01J 37/32449; H01J 37/3244; H01J 2237/334
    USPC ........................ 118/715; 156/345.33, 345.34
    See application file for complete search history.

(56) References Cited

U.S. PATENT DOCUMENTS

| | | | |
|---|---|---|---|
| 5,772,771 A * | 6/1998 | Li | C23C 16/507 118/715 |
| 7,482,283 B2 * | 1/2009 | Yamasaki | C23C 16/34 438/758 |
| 7,846,497 B2 | 12/2010 | Gold et al. | |
| 9,305,810 B2 | 4/2016 | Singh et al. | |
| 9,488,315 B2 | 11/2016 | Nangoy et al. | |
| 10,256,075 B2 | 4/2019 | Rogers | |
| 2003/0180458 A1 * | 9/2003 | Sneh | H01L 21/68785 427/248.1 |
| 2004/0029379 A1 * | 2/2004 | Yamasaki | C23C 16/45525 257/E21.17 |
| 2004/0050326 A1 * | 3/2004 | Thilderkvist | H01L 21/67253 156/345.33 |
| 2004/0112538 A1 | 6/2004 | Larson et al. | |
| 2005/0241763 A1 | 11/2005 | Huang et al. | |

(Continued)

OTHER PUBLICATIONS

PCT International Seach Report and Written Opinion for PCT/US2021/064872 dated Jun. 7, 2022.

*Primary Examiner* — Rudy Zervigon
(74) *Attorney, Agent, or Firm* — Moser Taboada

(57) ABSTRACT

Methods and apparatus for processing a substrate are provided herein. For example, an apparatus for processing a substrate comprises a top delivery gas nozzle configured to direct process gas toward a substrate support surface of a substrate support and a side delivery gas nozzle configured to direct the process gas toward a side surface of the substrate support, a first gas line connected to the top delivery gas nozzle, a second gas line connected to the side delivery gas nozzle, and a plurality of valves connected to the first gas line and the second gas line for providing process gas to the processing volume of the processing chamber, and a first orifice flow restrictor or a first needle valve connected to the first gas line or a second orifice flow restrictor or a second needle valve connected to the second gas line.

16 Claims, 10 Drawing Sheets

(56) References Cited

U.S. PATENT DOCUMENTS

| | | |
|---|---|---|
| 2007/0056929 A1 | 3/2007 | Miya et al. |
| 2007/0066038 A1 | 3/2007 | Sadjadi et al. |
| 2008/0233016 A1* | 9/2008 | Harvey ............ H01J 37/32477 |
| | | 422/119 |
| 2013/0255784 A1 | 10/2013 | Ye et al. |
| 2015/0000707 A1* | 1/2015 | Takahashi ......... H01J 37/32862 |
| | | 134/22.18 |
| 2015/0303035 A1 | 10/2015 | Shareef et al. |
| 2017/0031370 A1 | 2/2017 | Drewery |
| 2018/0061679 A1* | 3/2018 | Silveira ............ H01J 37/32899 |
| 2022/0010430 A1 | 1/2022 | Hayashi et al. |

* cited by examiner

METHODS AND APPARATUS FOR
PROCESSING A SUBSTRATE

FIELD

Embodiments of the present disclosure generally relate to a methods and apparatus for processing a substrate, and more particularly, to methods and apparatus configured to manage process gas flow to a processing volume of a processing chamber during operation.

BACKGROUND

Plasma processing apparatus including a plasma processing chamber, a gas source that supplies process gas into the processing chamber, and an energy source that produces plasma from the process gas are known. For example, plasma processing can include one or more plasma deposition processes (e.g., physical vapor deposition, chemical vapor deposition, atomic layer deposition, etc.), one or more plasma etch processes, or one or more other plasma processes. Typically, during plasma processing one or more process gases are introduced into a processing volume of a processing chamber. For example, with respect to plasma etch processes, multiple process gases, e.g., octafluorocyclobutane ($C_4F_8$), oxygen ($O_2$), sulfur hexafluoride ($SF_5$), etc., can be introduced into the processing chamber using a fast-switching process during etch cycles. Such processes, however, can be quite costly as multiple fast response-time atomic layer deposition (ALD) valves are required to achieve fast-switching between the process gases while maintaining the required flow parameters, such as uniform mass flow rates and pressure during the fast-switching.

SUMMARY

Methods and apparatus for processing a substrate are provided herein. In some embodiments, an apparatus for processing a substrate comprises a processing chamber comprising a chamber body and a lid, a top delivery gas nozzle extending through the lid and configured to direct process gas toward a substrate support surface of a substrate support disposed within a processing volume of the processing chamber, a side delivery gas nozzle extending through the chamber body and configured to direct the process gas toward a side surface of the substrate support, a first gas line connected to the top delivery gas nozzle, a second gas line connected to the side delivery gas nozzle, and a plurality of valves connected to the first gas line and the second gas line for providing process gas to the processing volume of the processing chamber, and at least one of a first orifice flow restrictor or a first needle valve connected to the first gas line or a second orifice flow restrictor or a second needle valve connected to the second gas line.

In accordance with at least some embodiments, a method of processing a substrate comprises supplying a process gas, via a first gas line connected to a top delivery gas nozzle, a second gas line connected to a side delivery nozzle, and a plurality of valves connected to the first gas line and the second gas line, to a processing volume of a process chamber and controlling a gas flow rate of the process gas through at least one of the top delivery gas nozzle or the side delivery nozzle via at least one of a first orifice flow restrictor or a first needle valve connected to the first gas line or a second orifice flow restrictor or a second needle valve connected to the second gas line.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
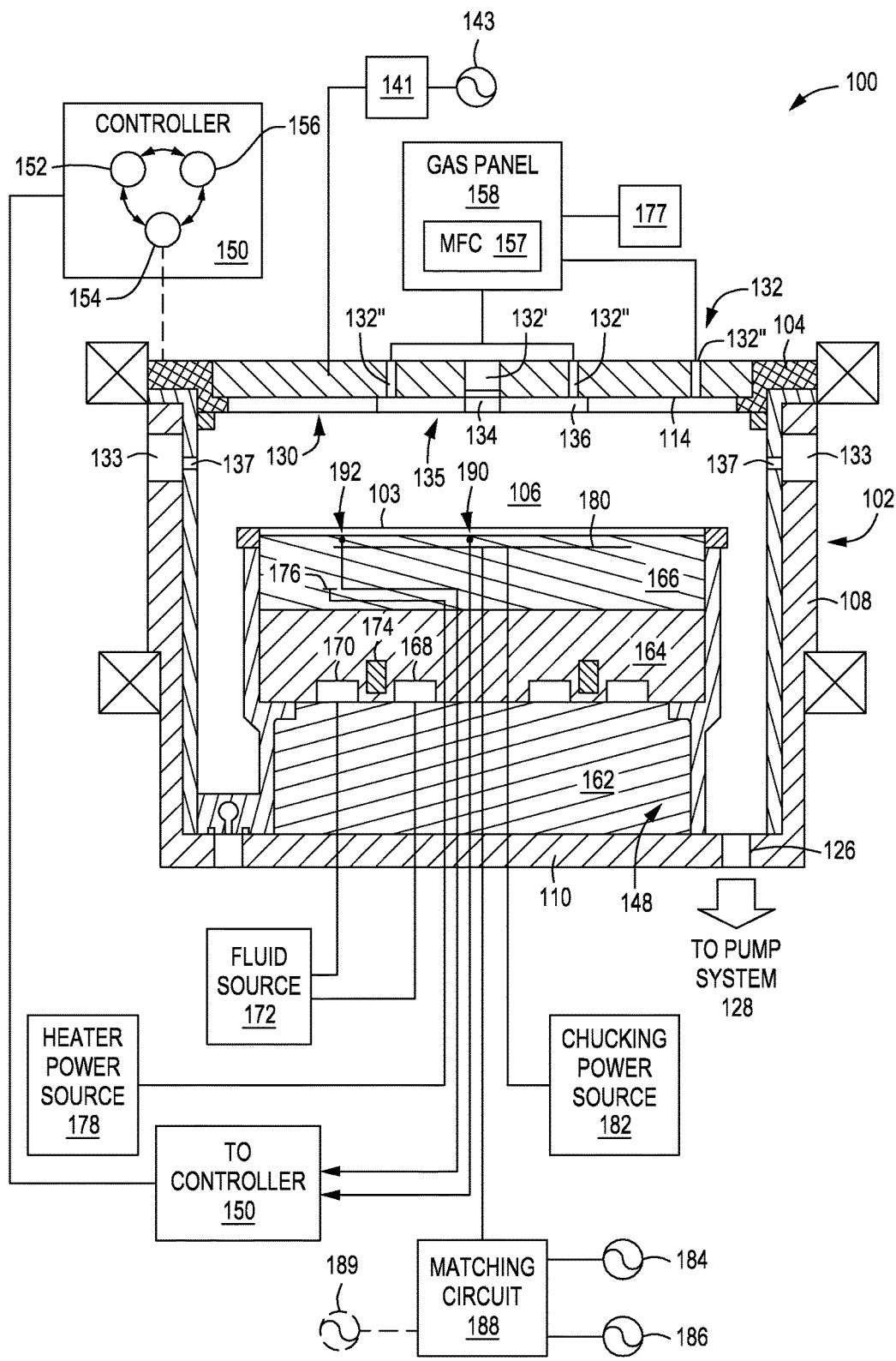
FIG. 1 is a schematic cross-sectional view of a processing chamber suitable for etching in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus configured to manage process gas flow to a processing volume of a processing chamber during operation are provided herein. For example, in at least some embodiments, apparatus may comprise a top delivery gas nozzle, a side delivery gas nozzle, and one or more orifice flow restrictors and/or needle valves connected to one or more separate gas lines that connect to the top delivery gas nozzle and the side delivery gas nozzle. The methods and apparatus described herein use a reduced number of fast-response time ALD valves—when compared to conventional methods and apparatus—while effectively managing process gas flow parameters, such as uniform mass flow rates and pressure to different sections of a processing volume during fast-switching, thus providing a more cost-effective method to perform fast-switching during operation.

FIG. 1 is a sectional view of one example of a processing chamber 100 suitable for performing an etch process in accordance with the present disclosure. Suitable processing chambers that may be adapted for use with the teachings disclosed herein include, for example, processing chambers available from Applied Materials, Inc. of Santa Clara, CA. Other processing chambers (PVD, CVD, ALD, etc.) may be adapted to benefit from one or more of the methods of the present disclosure.

The processing chamber 100 includes a chamber body 102 and a lid 104 which enclose a processing volume 106. The chamber body 102 is typically fabricated from aluminum, stainless steel or other suitable material. The chamber body 102 generally includes sidewalls 108 and a bottom 110. A substrate support access port (not shown) is generally defined in a sidewall 108 and is selectively sealed by a slit valve to facilitate entry and egress of a substrate 103 from the processing chamber 100. An exhaust port 126 is defined in the chamber body 102 and couples the processing volume 106 to a pump system 128, which can also function as a purge station. The pump system 128 generally includes one or more pumps and throttle valves utilized to evacuate and regulate the pressure of the processing volume 106 of the processing chamber 100. In embodiments, the pump system 128 is configured to maintain the pressure inside the processing volume 106 at operating pressures typically between about 1 mTorr to about 500 mTorr, between about 5 mTorr to about 100 mTorr, or between about 5 mTorr to 50 mTorr depending upon process needs.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to a gas panel to facilitate dissociating gas mixture from a remote plasma prior to entering the processing volume 106 for processing. In some embodiments, a RF source power 143 is coupled through a matching network 141 to the showerhead assembly 130. The RF source power 143 typically can produce up to about 5000 W for example between about 200 W to about 5000 W, or between 1000 W to 3000 W, or about 1500 W and optionally at a tunable frequency in a range from about 50 kHz to about 200 MHz.

In embodiments, a gas panel 158 is coupled to the processing chamber 100 and includes one or more mass flow controllers 157 to provide one or more process and/or cleaning gases to the processing volume 106. In the example depicted in FIG. 1, inlet ports 132', 132", 132''' are provided in the lid 104 to allow gases to be delivered from the gas panel 158 to the processing volume 106 of the processing chamber 100. In embodiments, the gas panel 158 is adapted to provide oxygen ($O_2$), an inert gas such as argon, helium (or other noble gas), or a gas mixture such as carbon tetrafluoride ($CF_4$), octafluorocyclobutane, or perfluorocyclobutane ($C_4F_8$), trifluoromethane ($CHF_3$), sulfur hexafluoride ($SF_6$), silicon tetrafluoride or tetrafluorosilane ($SiF_4$), etc., through the inlet ports 132', 132", 132''' and into the interior volume 106 of the processing chamber 100. In at least some embodiments, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $O_2$, carbon dioxide ($CO_2$), $H_2O$, nitrous oxide ($N_2O$), nitrogen dioxide ($NO_2$), ozone ($O_3$), and the like. Non-limiting examples of nitrogen containing gas includes $N_2$, ammonia ($NH_3$), and the like. Non-limiting examples of chlorine containing gas includes hydrogen chloride (HCl), chlorine ($Cl_2$), carbon tetrachloride ($CCl_4$), and the like. In embodiments, a showerhead assembly 130 is coupled to an interior surface 114 of the lid 104. The showerhead assembly 130 includes a plurality of apertures that allow the gases flowing through the showerhead assembly 130 from the inlet ports 132', 132", 132''' into the processing volume 106 of the processing chamber 100 in a predefined distribution across the surface of the substrate 103 (e.g., center, middle, side) being processed in the processing chamber 100.

A In one embodiment, the showerhead assembly 130 is configured with a plurality of zones that allow for separate control of gas flowing into the processing volume 106 of the processing chamber 100. In the example illustrated in FIG. 1, the showerhead assembly 130 comprises a top delivery gas nozzle 135 that is configured to direct the process gas toward a substrate support surface of the substrate support 148. Accordingly, the top delivery gas nozzle 135 includes a center flow outlet 134 configured for center flow control and a middle flow outlet 136 configured for middle flow control that are separately coupled to the gas panel 158 through corresponding inlet ports 132', 132". Additionally, one or more side delivery gas nozzles can extend through the chamber body 102 and can be configured to direct the process gas toward a side surface of the substrate support 148. For example, in at least some embodiments, a side delivery gas nozzle 133 can include side flow outlets 137 configured for side flow control that is separately coupled to the gas panel 158 through the inlet port 132'''. Unlike the center flow outlet 134 and the middle flow outlet 136 which are disposed on the lid 104, the side flow outlets 137 are disposed along an interior of the sidewalls 108 of the processing chamber in a generally circular manner. The center flow outlet 134 and the middle flow outlet 136 are configured to provide process gas to substantially etch a center zone and a middle zone (e.g., between the center and an edge) of a substrate, and the side flow outlets 137 that are disposed along are configured to provide process gas to substantially etch an edge area (or perimeter) of a substrate, as described in greater detail below.

In some embodiments, the substrate support 148 is disposed in the processing volume 106 of the processing chamber 100 below the gas distribution assembly such as showerhead assembly 130. The substrate support 148 holds the substrate 103 during processing. The substrate support 148 generally includes a plurality of lift pins (not shown) disposed therethrough that are configured to lift the substrate 103 from the substrate support 148 and facilitate exchange of the substrate 103 with a robot (not shown) in a conventional manner. An inner liner 118 may closely circumscribe the periphery of the substrate support 148.

In one embodiment, the substrate support 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises the clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support 148 by clamping, vacuum, or gravity.

A base 164 or electrostatic chuck 166 may include heater 176 (e.g., at least one optional embedded heater), at least one optional embedded isolator 174 and a plurality of conduits 168, 170 to control the lateral temperature profile of the substrate support 148. The plurality of conduits 168, 170 are fluidly coupled to a fluid source 172 that circulates a temperature regulating fluid therethrough. The heater 176 is regulated by a power source 178. The plurality of conduits 168, 170 and heater 176 are utilized to control the temperature of the base 164, heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 and the substrate 103. In embodiments, the temperature of the substrate may be maintained at 20 degrees Celsius to 450 degrees Celsius, such as 100 degrees Celsius to 300 degrees Celsius, or 150 degrees Celsius to 250 degrees Celsius.

In one embodiment, the substrate support 148 is configured as a cathode and includes a clamping electrode 180 that is coupled to the RF bias power source 184 and RF bias power source 186. The RF bias power source 184 and RF bias power source 186 are coupled between the clamping electrode 180 disposed in the substrate support 148 and another electrode, such as the showerhead assembly 130 or (lid 104) of the chamber body 102. The RF bias power excites and sustains a plasma discharge formed from the gases disposed in the processing region of the chamber body 102.

Still referring to FIG. 1, in some embodiments the RF bias power source 184 and RF bias power source, 186 are coupled to the clamping electrode 180 disposed in the substrate support 148 through a matching circuit 188. The signal generated by the RF bias power source 184 and RF bias power source 186 is delivered through matching circuit 188 to the substrate support 148 through a single feed to ionize the gas mixture provided in the plasma processing chamber such as processing chamber 100, thus providing ion energy necessary for performing an etch deposition or other plasma enhanced process. The RF bias power source 184 and RF bias power source 186 are generally capable of producing an RF signal having a frequency of from about 50 kHz to about 200 MHz and a power between about 0 Watts and about 500 Watts, 1 Watt (W) to about 100 W, or about 1 W to about 30 W. An additional bias power 189 may be coupled to the clamping electrode 180 to control the characteristics of the plasma.

A controller 150 is coupled to the processing chamber 100 to control operation of the processing chamber 100. The controller 150 includes a central processing unit 152, a memory 154 (e.g., a nontransitory computer readable storage medium), and a support circuit 156 utilized to control the process sequence and regulate the gas flows from the gas panel 158. The central processing unit 152 may be any form of general-purpose computer processor that may be used in an industrial setting. The software routines (e.g., executable instructions stored) can be stored in the memory 154, such as random-access memory, read only memory, floppy, or hard disk drive, or other form of digital storage. The support circuit 156 is conventionally coupled to the central processing unit 152 and may include cache, clock circuits, input/output systems, power supplies, and the like. Bi-directional communications between the controller 150 and the various components of the processing chamber 100 are handled through numerous signal cables.

Figure 2:
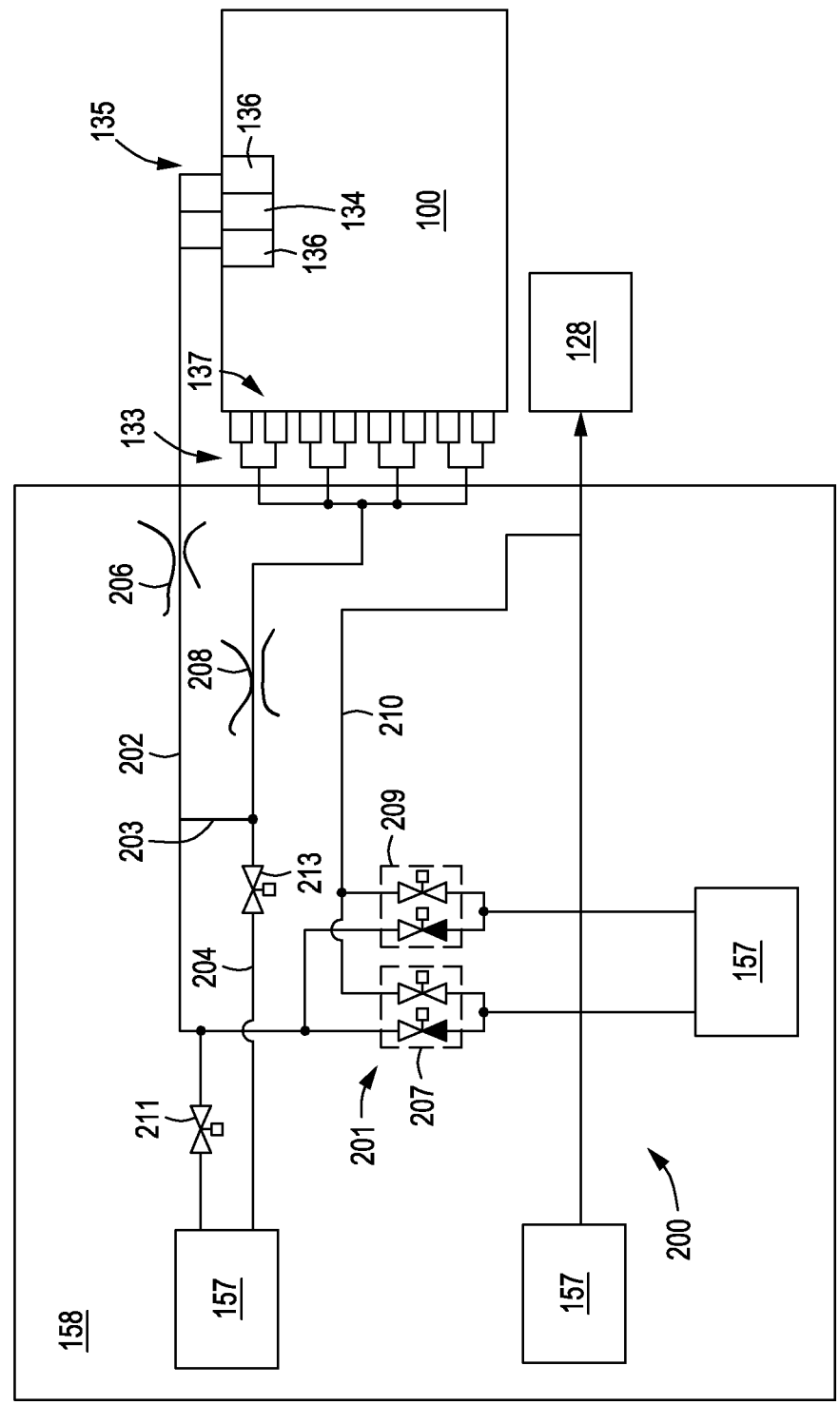
FIG. 2 is a schematic diagram of a gas flow delivery system in accordance with at least some embodiments of the present disclosure.

FIG. 2 is a schematic diagram of a gas flow delivery system 200 in accordance with at least some embodiments of the present disclosure. For example, the gas flow delivery system 200 is configured for use with the gas panel 158 of the processing chamber 100. As noted above, the gas panel 158 includes the top delivery gas nozzle 135 that includes the center flow outlet 134 and the middle flow outlet 136 and the side delivery gas nozzle 133 that includes the side flow outlets 137. For illustrative purposes, eight side flow outlets 137 of the side delivery gas nozzle 133 are shown aligned along a vertical axis. As noted above, however, in an assembled configuration the eight side flow outlets 137 would normally be disposed in a generally circular manner along the interior of the sidewalls 108 (e.g., surrounding the substrate support 148).

A first gas line 202 is connected to the top delivery gas nozzle 135 and a second gas line 204 is connected to the side delivery gas nozzle 133. The first gas line 202 and the second gas line 204 are also connected to each other via a third gas line 203 at a location prior to process gas entering a first orifice flow restrictor 206 (or a first needle valve) connected to the first gas line 202 or a second orifice flow restrictor 208 (or the second needle valve) connected to the second gas line 204. The first orifice flow restrictor 206 and the second orifice flow restrictor 208 are configured to restrict or maintain a flow of the process gas to a predetermined flow rate. For example, the predetermined flow rate can be about 300 sccm to about 3000 sccm. Additionally, the first orifice flow restrictor 206 and the second orifice flow restrictor 208 are set to the predetermined flow rate and cannot be adjusted in-situ, e.g., during operation.

Additionally, a plurality of valves 201 (e.g., fast closing valves) are connected to the first gas line 202 and the second gas line 204 for providing process gas to the processing volume 106 of the processing chamber 100. For example, in at least some embodiments, the plurality of valves 201 can include four connected valves. The four connected valves can include a first pair of valves 207 and a second pair of valves 209. Each of the first pair of valves 207 and the second pair of valves 209 comprises a valve that has an output that is connected to the first gas line 202 and the second gas line 204 and a valve that has an output that is connected to a purge line 210. Additionally, each valve of the first pair of valves 207 and the second pair of valves 209 has an input that is connected to the one or more mass flow controllers 157. The valves of the first pair of valves 207 and the second pair of valves 209 can be the same as each other of different from each other.

One or more additional valves can also be provided. For example, in at least some embodiments, a valve 211 and a valve 213 can be connected to the mass flow controllers 157 and provided on the first gas line 202 and the second gas line 204, respectively. The valve 211 and valve 213 are configured to control the entry of other types of process gasses which do not require to be fast switched.

The purge line 210 can be connected to at least one of an input or output of the plurality of valves 201 and configured to purge the process gas from the first gas line 202 and the second gas line 204. For example, with respect to FIG. 2, the purge line 210, as noted above, is connected to an output of a valve of each of the first pair of valves 207 and the second pair of valves 209. Other connection configurations of the purge line 210 are described in greater detail below.

Figure 3:
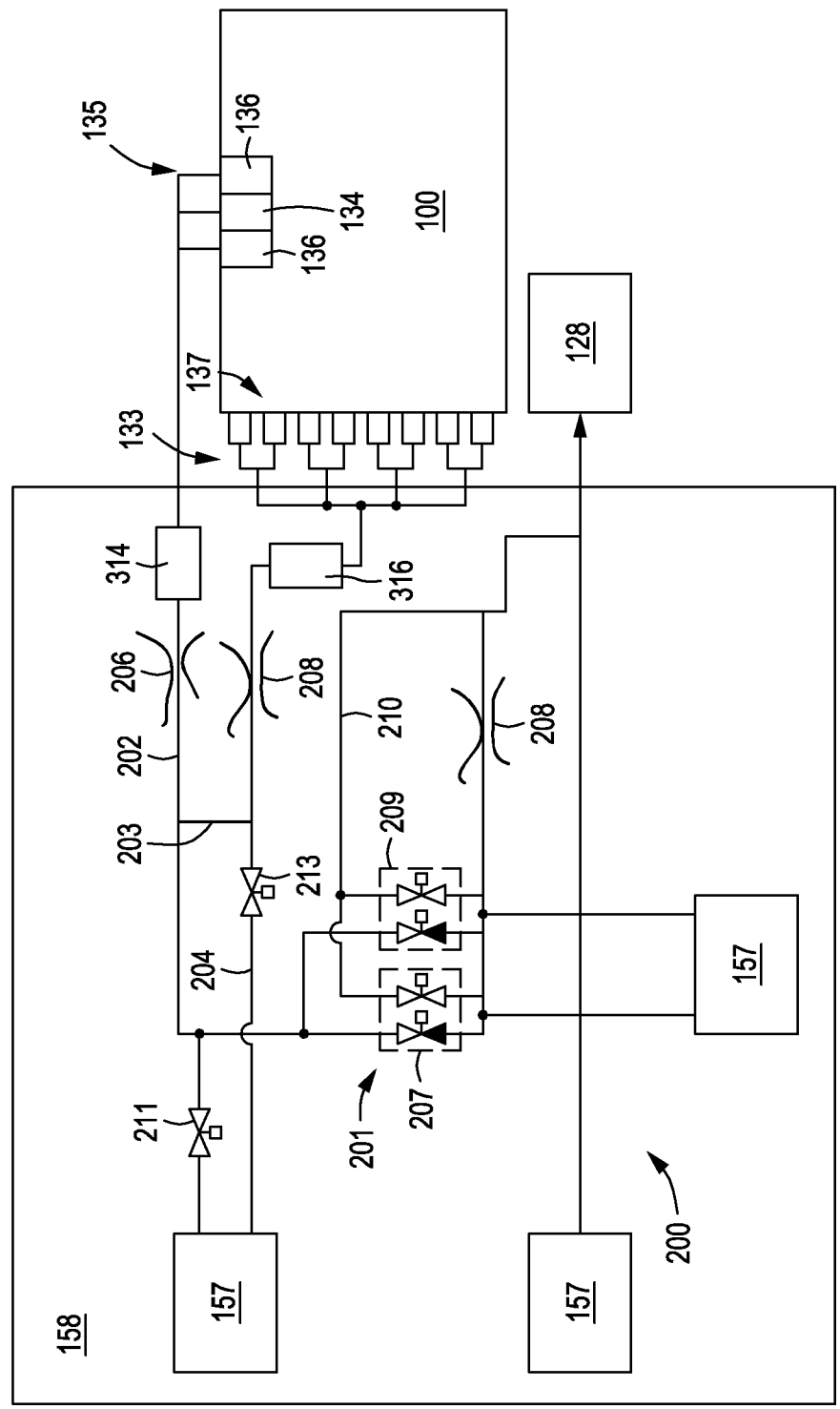
FIG. 3 is a schematic diagram of a gas flow delivery system in accordance with at least some embodiments of the present disclosure.

For example, FIG. 3 is a schematic diagram of the gas flow delivery system 200 in accordance with at least some embodiments of the present disclosure. The gas flow delivery system 200 of FIG. 3 is substantially identical to that of FIG. 2. Accordingly, only those features of the gas flow delivery system 200 that are unique to FIG. 3 are described herein.

For example, in FIG. 3, the purge line 210 is connected to the output of a valve of each of the first pair of valves 207 and the second pair of valves 209 and is also connected to the input of each valve of the first pair of valves and the second pair of valves 209.

Moreover, in FIG. 3 one or more mass flow meters are sized (e.g., ¼ inch, or larger or smaller) to be connected to the first gas line 202 and/or the second gas line 204. For example, a first mass flow meter 314 and a second mass flow meter 316 are connected to the first gas line 202 and the second gas line 204, respectively. The first mass flow meter 314 and the second mass flow meter 316 are connected at a location adjacent the top delivery gas nozzle 135 and the side delivery gas nozzle 133, e.g., after the first orifice flow restrictor 206 and the second orifice flow restrictor 208. The first mass flow meter 314 and the second mass flow meter 316 are configured to measure a flow rate of the process gas respectively therethrough and transmit the measured flow rate to the controller 150, which, in turn, can adjust the mass flow controllers 157 based on the measured flow rate.

Figure 4:
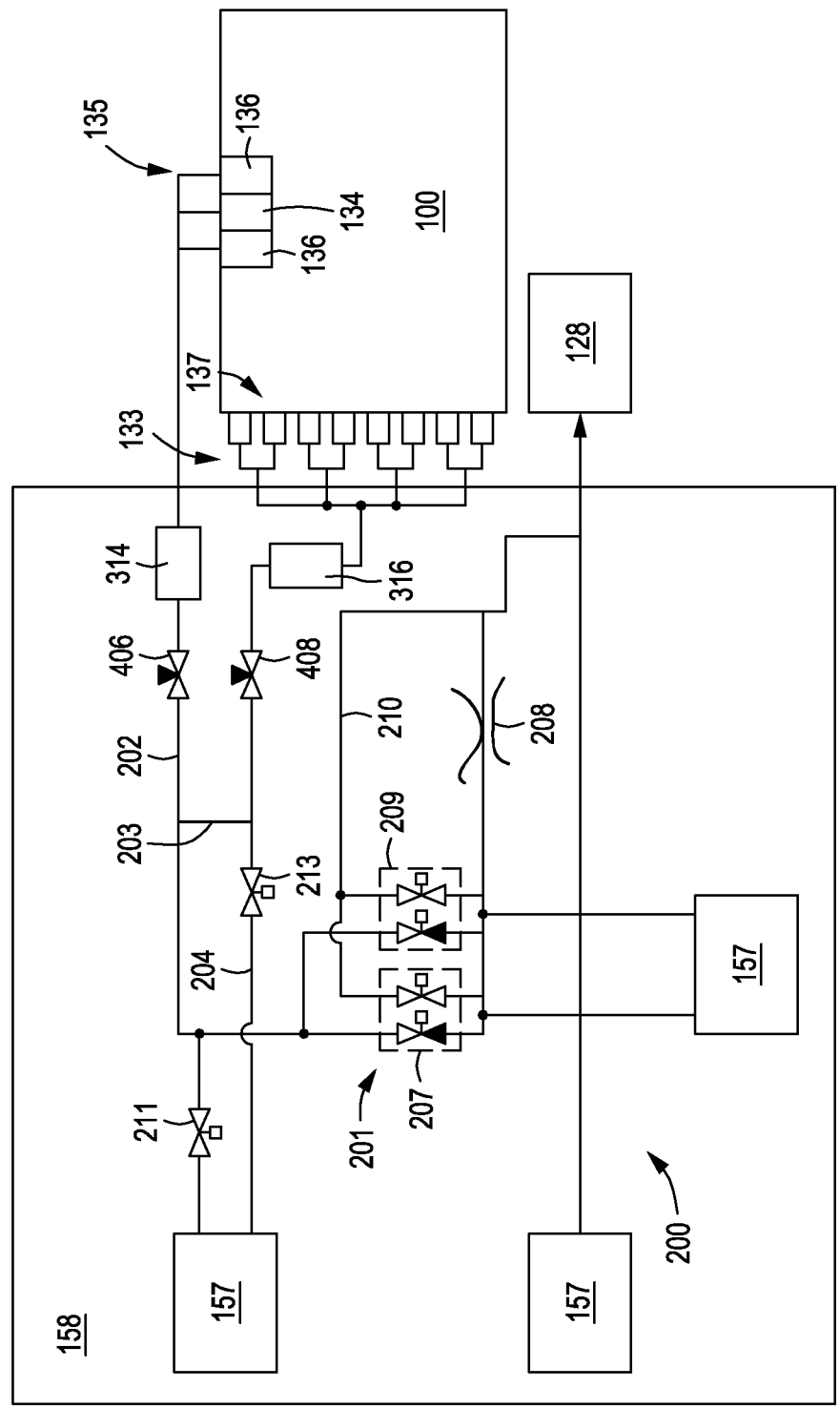
FIG. 4 is a schematic diagram of a gas flow delivery system in accordance with at least some embodiments of the present disclosure.

FIG. 4 is a schematic diagram of the gas flow delivery system 200 in accordance with at least some embodiments of the present disclosure. The gas flow delivery system 200 of FIG. 4 is substantially identical to that of FIGS. 2 and 3. Accordingly, only those features of the gas flow delivery system 200 that are unique to FIG. 4 are described herein.

For example, in FIG. 4, as noted above, one or more of the above-described orifice flow restrictors can be replaced with one or more needle valves. For example, in FIG. 4, one or both of the first orifice flow restrictor 206 and the second orifice flow restrictor 208 can be replaced with a respective needle valve. For example, as shown in FIG. 4, both the first orifice flow restrictor 206 and the second orifice flow restrictor 208 can be replaced with a first needle valve 406 and a second needle valve 408, respectively. Alternatively, any combination of orifice flow restrictors and more needle valves can be used.

Figure 5:
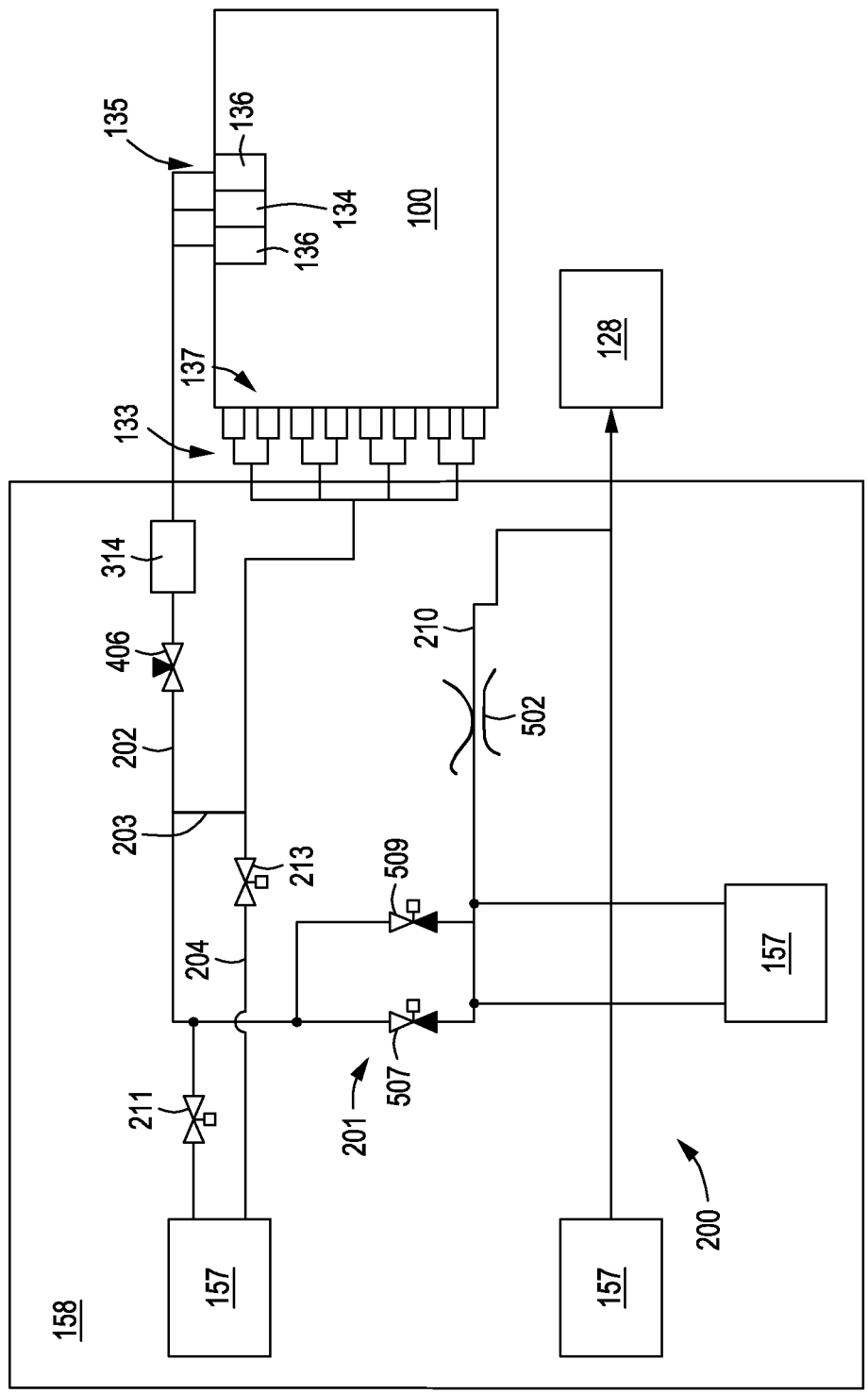
FIG. 5 is a schematic diagram of a gas flow delivery system in accordance with at least some embodiments of the present disclosure.

FIG. 5 is a schematic diagram of a gas flow delivery system 200 in accordance with at least some embodiments of the present disclosure. The gas flow delivery system 200 of FIG. 5 is similar to that of the gas flow delivery system 200. Accordingly, only those features that are unique to the gas flow delivery system 200 of FIG. 5 are described herein.

For example, in FIG. 5 unlike the first pair of valves 207 and the second pair of valves 209, which comprise a valve having an input to the mass flow controller 157 and an output connected to the purge line 210, the purge line 210 is directly connected to the one or more mass flow controllers (e.g., the mass flow controllers 157). That is, the purge gas (e.g., dump) flows through an orifice restrictor 502, thus providing a higher flow resistance to the purge gas and reducing the number of valves that are, typically, required. Accordingly, in at least some embodiments, instead of having the first pair of valves 207 and the second pair of valves 209, the gas flow delivery system 200 comprises a first valve 507 and a second valve 509. Each of the first valve 507 and the second valve 509 include an input that is connected to one or more mass flow controllers (e.g., the mass flow controller 157) and an output that is connected to the first gas line 202 and the second gas line 204.

In the embodiment of FIG. 5, one or more of the orifice flow restrictors or needle valves and mass flow meters can be connected to the first gas line and/or the second gas line. For example, in at least some embodiments, each of the first gas line 202 and the second gas line 204 can include one or more orifice flow restrictors/needle valves and mass flow meters. For example, in the illustrated embodiment, the first needle valve 406 and the first mass flow meter 314 are shown connected to the first gas line 202.

Figure 6:
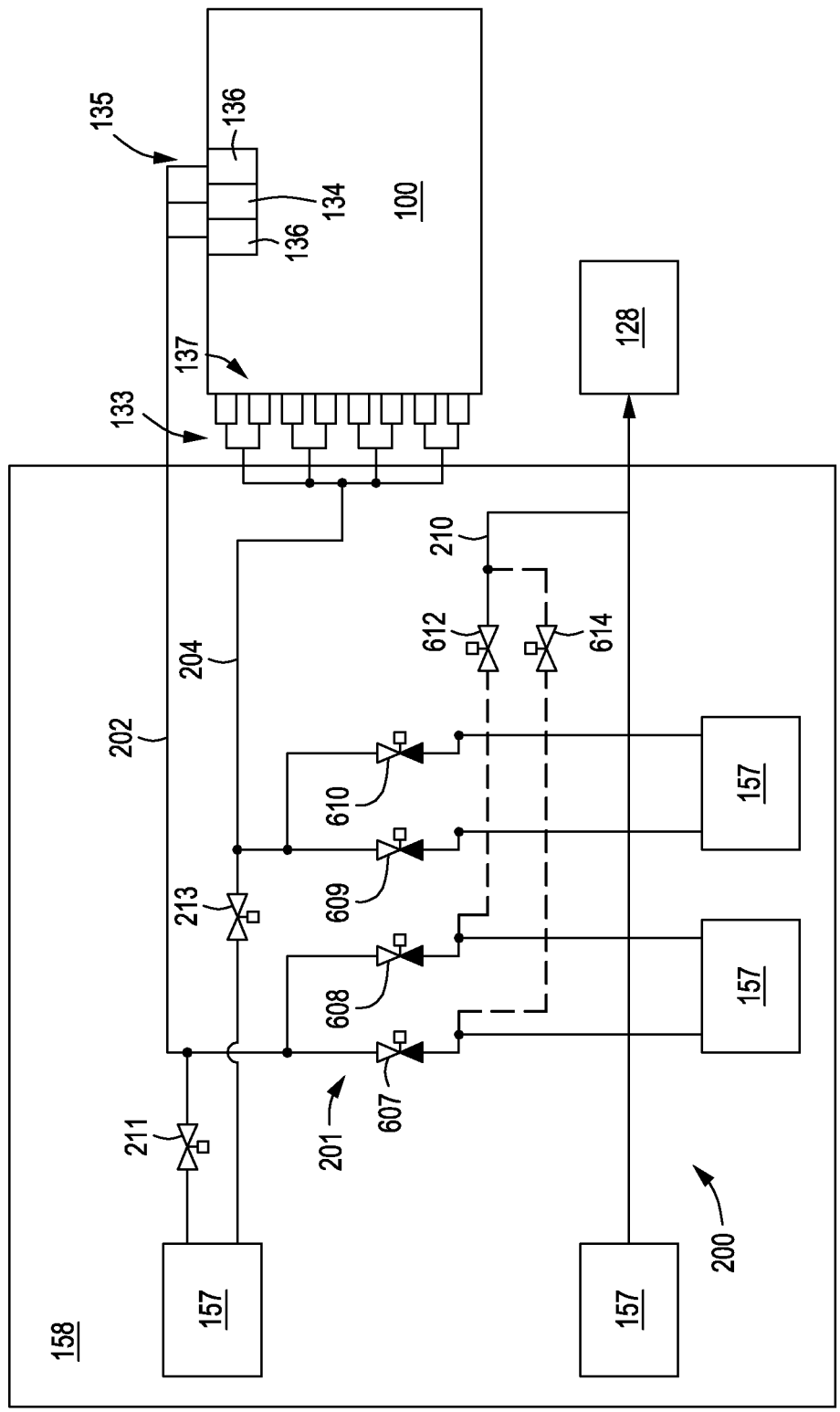

FIG. 6 is a schematic diagram of a gas flow delivery system 200 in accordance with at least some embodiments of the present disclosure. The gas flow delivery system 200 of FIG. 6 is similar to the previously described gas flow delivery systems. Accordingly, only those features that are unique to the gas flow delivery system 200 of FIG. 6 are described herein.

FIG. 6 uses common dump valves for center and edge flows, thus reducing the number of valves required. For example, a valve 612 and a valve 614 are connected to the purge line 210. Additionally, unlike the previously described gas flow delivery systems 200, the first gas line 202 and the second gas line 204 of the gas flow delivery system 200 of FIG. 6 are not connected to each other via the third gas line 203. For example, the gas flow delivery system 200 of FIG. 6 comprises a first VCR fitting 607, a second VCR fitting 608, a third VCR fitting 609, and a fourth VCR fitting 610. The first VCR fitting 607 and the second VCR fitting 608 are connected to each other, the mass flow controller 157, and the first gas line 202 to provide process gas to the top delivery gas nozzle 135. Similarly, the third VCR fitting 609 and the fourth VCR fitting 610 are connected to each other, the mass flow controller 157, and the second gas line 204 to provide process gas to the side delivery gas nozzle 133, thus there is no need for a third gas line.

Figure 7:
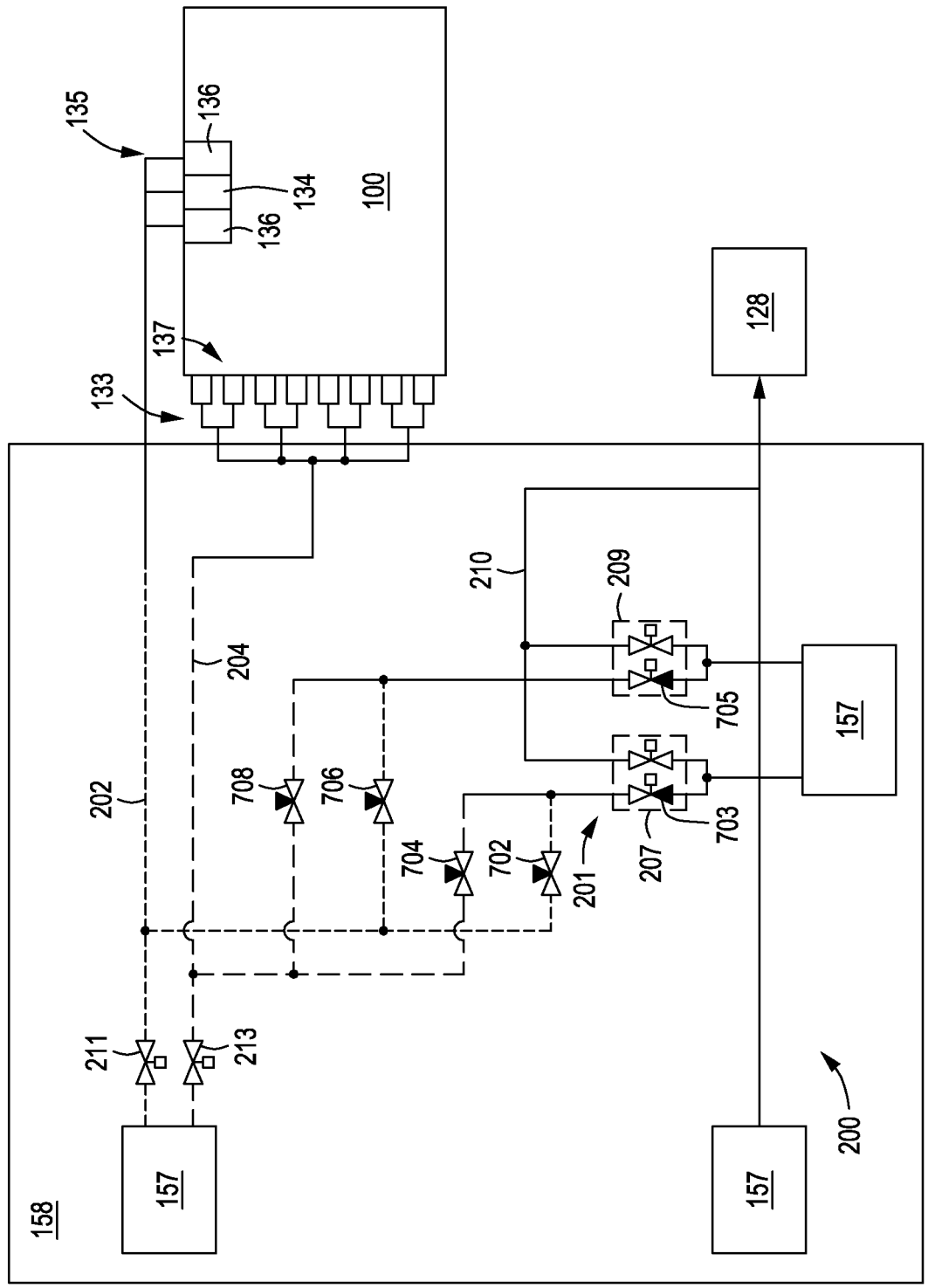
FIG. 7 is a schematic diagram of a gas flow delivery system in accordance with at least some embodiments of the present disclosure.
Figure 8:
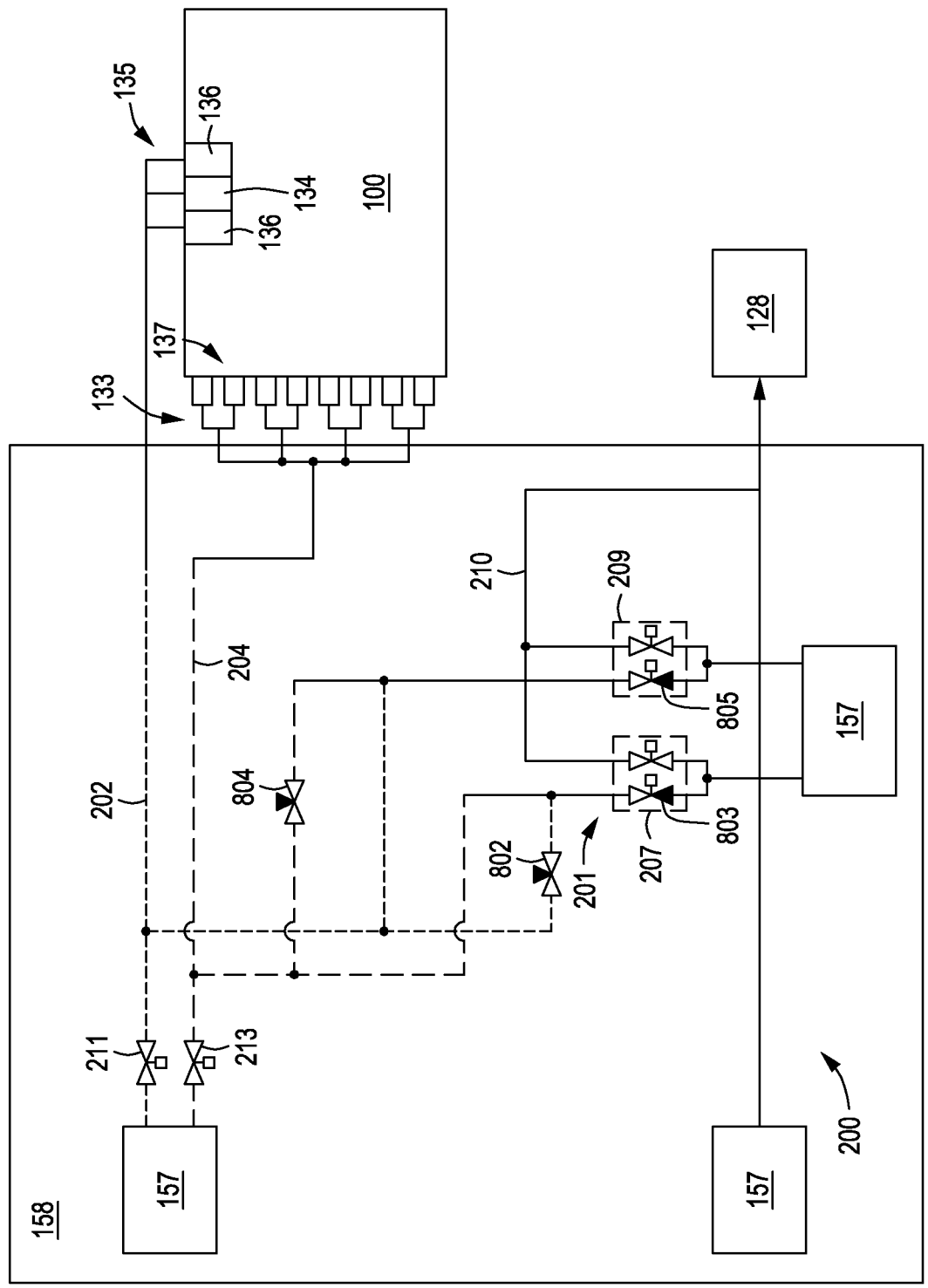
FIG. 8 is a schematic diagram of a gas flow delivery system in accordance with at least some embodiments of the present disclosure.

FIG. 7 and FIG. 8 are schematic diagrams of the gas flow delivery system 200 in accordance with at least some embodiments of the present disclosure. The gas flow delivery system 200 of FIGS. 7 and 8 are similar to the previously described gas flow delivery systems. Accordingly, only those features that are unique to the gas flow delivery system 200 of FIGS. 7 and 8 are described herein.

The gas flow delivery system 200 of FIGS. 7 and 8 are capable of providing different flow ratio distributions of process gasses to the top delivery gas nozzle 135 and the side delivery gas nozzle 133. For example, the first gas line 202 and the second gas line 204 are connected parallelly to an output of at least one of the plurality of valves, e.g., the first pair of valves 207 and the second pair of valves 209. Accordingly, each of the first pair of valves 207 and the second pair of valves 209 comprises a valve that has a split output with one or more orifice flow restrictors or needle valves that are connected to the first gas line 202 and the second gas line 204. For example, with respect to FIG. 7, a valve 703 has a split output that connects to an orifice flow restrictor or needle valve 702 (needle valve shown) connected to the first gas line 202 and an orifice flow restrictor or needle valve 704 (needle valve shown) connected to the second gas line 204. Similarly, a valve 705 has the split output that connects to an orifice flow restrictor or needle valve 706 (needle valve shown) connected to the first gas line 202 and an orifice flow restrictor or needle valve 708 (needle valve shown) connected to the second gas line 204.

Similarly, with respect to FIG. 8 a valve 803 has a split output that connects to an orifice flow restrictor or needle valve 802 (needle valve shown) connected to either the first gas line 202 or an orifice flow restrictor or needle valve connected to the second gas line 204. For illustrative purposes, the needle valve 802 is shown connected to the first gas line 202. Likewise, a valve 805 has a split output that is connected to an orifice flow restrictor or needle valve 804 (needle valve shown) connected to either the first gas line 202 or an orifice flow restrictor or needle valve 804 (needle valve shown) connected to the second gas line 204. For illustrative purposes, the needle valve 804 is shown connected to the second gas line 204.

Additionally, with respect to FIGS. 7 and 8 each of the first pair of valves 207 and the second pair of valves 209 comprises a valve that has an output that is connected to a purge line 210. Additionally, each valve of the first pair of valves 207 and the second pair of valves 209 has an input that is connected to the one or more mass flow controllers 157.

Figure 9:
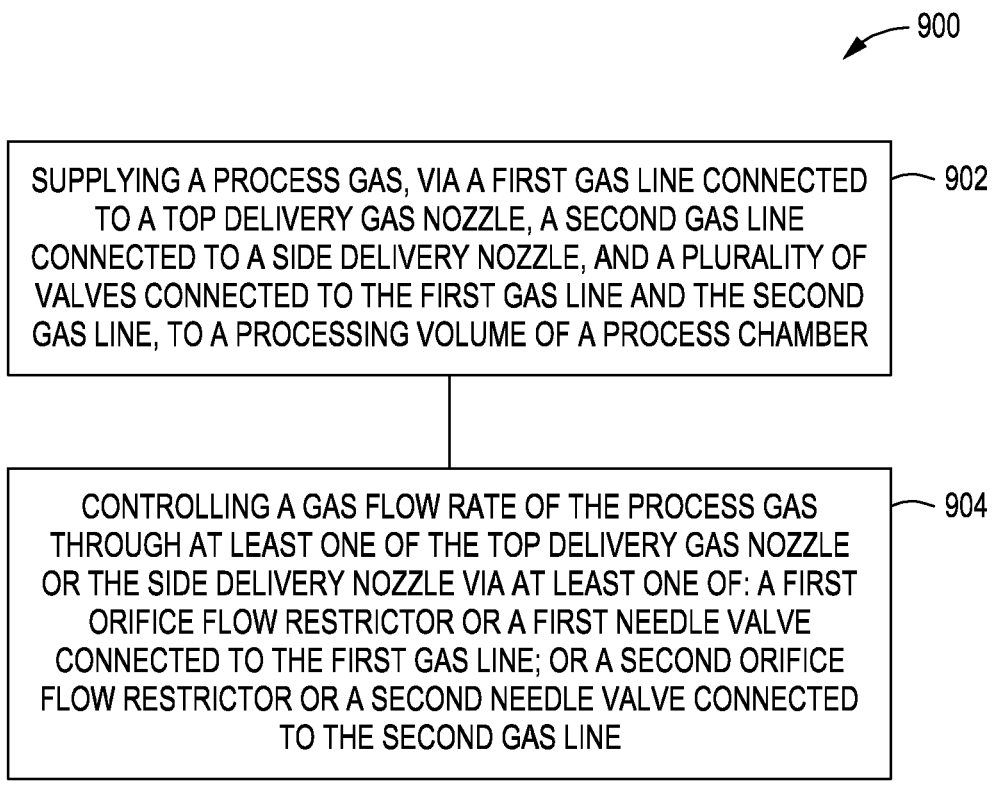
FIG. 9 is a flowchart of a method for processing a substrate in accordance with at least some embodiments of the present disclosure.

FIG. 9 is a flowchart of a method 900 for processing a substrate in accordance with at least some embodiments of the present disclosure. For example, in at least some embodiments, the method 900 can be used during one or more plasma processes, e.g., a deposition process and/or an etch process.

For example, at 902, the method includes supplying a process gas, via a first gas line (e.g., the first gas line 202) connected to a top delivery gas nozzle (e.g., the top delivery gas nozzle 135), a second gas line (e.g., the first gas line 202) connected to a side delivery nozzle (e.g., side delivery gas nozzle 133), and a plurality of valves (e.g., via one or more of the valve configurations of FIGS. 2-8) connected to the first gas line and the second gas line. The process gas is then supplied from the top delivery gas nozzle and the side delivery nozzle to a processing volume of a process chamber (e.g., the processing volume 106 of the processing chamber 100).

Figure 10A:
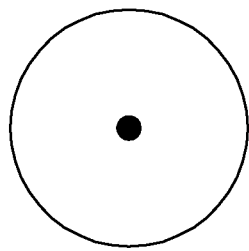
FIGS. 10A-10C are diagrams of process zones of a substrate processed in accordance with at least some embodiments of the present disclosure.
Figure 10B:
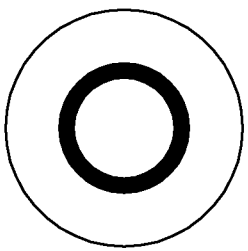
Figure 10C:
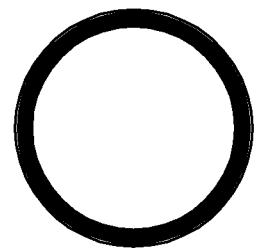

Next, at 904, the method 900 includes controlling a gas flow rate of the process gas through at least one of the top delivery gas nozzle or the side delivery nozzle via at least one of a first orifice flow restrictor or a first needle valve connected to the first gas line or a second orifice flow restrictor or a second needle valve connected to the second gas line. For example, during an etching process, one or more of the above process gases can be used to etch various zones (or areas) of a substrate. For example, during a first etch cycle, one or more process gases can be provided into the processing volume 106 via, for example, the side delivery gas nozzle 133. In at least some embodiments, one or more of the above-described process gases (e.g., $O_2$, $Cl_2$, $CCl_4O_2$, $CO_2$, HCl, $N_2$, $NH_3$, $N_2O$, $NO_2$, $O_3$, $H_2O$, $SF_6$ and the like) can be provided into the processing volume 106 via the side delivery gas nozzle 133. For example, in at least some embodiments, the process gas used during the first etch cycle can be $O_2$. The flow rate of the process gas through the side flow outlets 137 of the side delivery gas nozzle 133 is controlled by the one or more second orifice flow restrictors or a second needle valves connected to the second gas line. The etchants can be concentrated toward the side surfaces of the substrate (see FIG. 10C). In at least some embodiments, during the first etch cycle the process time can be about 0.2 seconds to about 0.6 seconds, and in some embodiments, about 0.4 seconds. In at least some embodiments, the RF source power can be about 155 W to about 3000 W, and in some embodiments about 2000 W. In at least some embodiments, the RF bias power can be about 0 to 100 W (pulsed or continuous), and in some embodiments about 50 W (pulsed). In at least some embodiments, a pressure of about 20 mTorr to about 80 mTorr, and in some embodiments about 50 mTorr.

Prior to performing a second etch cycle, the method 900 can comprise purging the process gas from the processing volume of the process chamber or from at least one of the first gas line and the second gas line via a purge line connected to at least one of an input or output of the plurality of valves.

Additionally, at 904, during a second etch cycle, one or more process gases can be provided into the processing volume 106 via, for example, the top delivery gas nozzle 135. For example, in at least some embodiments, one or more of the above-described process gases (e.g., $O_2$, $Cl_2$, $CCl_4O_2$, $CO_2$, HCl, $N_2$, $NH_3$, $N_2O$, $NO_2$, $O_3$, $H_2O$, $SF_6$ and the like) can be provided into the processing volume 106 via the top delivery gas nozzle 135. For example, in at least some embodiments, the process gas used during the second etch cycle can be $SF_6$. The flow rate of the process gas through the center flow outlet 134 and the middle flow outlet 136 is controlled by the one or more first orifice flow restrictors or the first needle valves connected to the first gas line. The etchants can be concentrated toward a center surface and a middle surface of the substrate (see FIGS. 10A and 10B, respectively). In at least some embodiments, during the second etch cycle the process time can be about 0.2 seconds to about 0.6 seconds, and in some embodiments, about 0.4 seconds. In at least some embodiments, the RF source power can be about 155 W to about 3000 W, and in some embodiments about 2000 W. In at least some embodiments, the RF bias power can be about 0 to 100 W (pulsed or continuous), and in some embodiments about 50 W (pulsed). In at least some embodiments, a pressure of about 20 mTorr to about 80 mTorr, and in some embodiments about 50 mTorr.

As noted above, when the same flow ratio (e.g., 50:50) distributions of process gases needs to be delivered to the top delivery gas nozzle 135 and the side delivery gas nozzle 133, the gas flow delivery system 200 of FIGS. 2-6 can be used. When different flow ratio (e.g., 70:30) distributions of process gasses need to be delivered to the top delivery gas nozzle 135 and the side delivery gas nozzle 133, however, the gas flow delivery system 200 of FIGS. 7 and 8 can be used.

During 902 and 904 a mass flow meter connected to at least one of the first gas line 202 or the second gas line 204 can be used to measure the gas flow.

While the foregoing is directed to embodiments of the present disclosure, other and further embodiments of the disclosure may be devised without departing from the basic scope thereof.

The invention claimed is:
1. An apparatus for processing a substrate, comprising:
a processing chamber comprising a chamber body and a lid;
a top delivery gas nozzle extending through the lid and configured to direct process gas toward a substrate support surface of a substrate support disposed within a processing volume of the processing chamber;

a side delivery gas nozzle extending through the chamber body and configured to direct the process gas toward a side surface of the substrate support;

a first gas line connected to the top delivery gas nozzle, a second gas line connected to the side delivery gas nozzle, and a plurality of valves that have outputs coupled to each other to connect to the first gas line and from the first gas line to the second gas line via a third gas line for providing process gas to the processing volume of the processing chamber; and at least one of:

a first orifice flow restrictor or a first needle valve connected to the first gas line: or a second orifice flow restrictor or a second needle valve connected to the second gas line.

2. The apparatus of claim 1, further comprising a mass flow meter connected to at least one of the first gas line or the second gas line.

3. The apparatus of claim 1, further comprising a purge line connected to at least one of an input or output of the plurality of valves and configured to purge the process gas from the first gas line and the second gas line.

4. The apparatus of claim 3, wherein the purge line is connected to the input of the plurality of valves and the purge line comprises a third orifice flow restrictor or a third needle valve.

5. The apparatus of claim 1, wherein the first gas line and the second gas line are connected to each other at a location prior to the process gas entering the first orifice flow restrictor or the first needle valve connected to the first gas line or the second orifice flow restrictor or the second needle valve connected to the second gas line.

6. The apparatus of claim 5, wherein the plurality of valves comprises a first pair of valves and a second pair of valves.

7. The apparatus of claim 6, wherein each of the first pair of valves and the second pair of valves comprises a valve that has an output that is connected to the first gas line and the second gas line and a valve that has an output that is connected to a purge line.

8. The apparatus of claim 6, wherein each valve of the first pair of valves and the second pair of valves has an input that is connected to one or more mass flow controllers.

9. The apparatus of claim 8, wherein each of the first pair of valves and the second pair of valves includes an input that is connected to one or more mass flow controllers and an output that is connected to the first gas line and the second gas line, and wherein a purge line is directly connected to the one or more mass flow controllers.

10. The apparatus of claim 1, wherein an output of at least one of the plurality of valves is connected parallelly to the first gas line and the second gas line.

11. The apparatus of claim 10, wherein the plurality of valves comprises a first pair of valves and a second pair of valves.

12. The apparatus of claim 11, wherein each of the first pair of valves and the second pair of valves comprises a valve that has a split output with the at least one of the first orifice flow restrictor or the first needle valve connected to the first gas line and the second orifice flow restrictor or the second needle valve connected to the second gas line.

13. The apparatus of claim 1, wherein the first gas line comprises the first orifice flow restrictor or the first needle valve and the second gas line comprises the second orifice flow restrictor or the second needle valve.

14. The apparatus of claim 1, wherein the top delivery gas nozzle comprises a center flow outlet configured for center flow control and a middle flow outlet configured for middle flow control, and wherein the center flow outlet and the middle flow outlet are coupled to a gas panel through inlet ports.

15. The apparatus of claim 1, wherein the side delivery gas nozzle comprises side flow outlets configured for side flow control, and wherein the side flow outlets are coupled to a gas panel through a corresponding inlet port.

16. The apparatus of claim 1, wherein the processing chamber is configured to perform at least one of a plasma deposition process or an etch process.

* * * * *